United States Patent [19]

Harford

[11] 4,275,362

[45] Jun. 23, 1981

[54] GAIN CONTROLLED AMPLIFIER USING A PIN DIODE

[75] Inventor: Jack R. Harford, Flemington, N.J.

[73] Assignee: RCA Corporation, New York, N.Y.

[21] Appl. No.: 21,324

[22] Filed: Mar. 16, 1979

[51] Int. Cl.³ .......................... H03G 3/30; H03G 9/24
[52] U.S. Cl. ................................................... 330/283
[58] Field of Search ........................... 330/283; 357/58

[56] References Cited

U.S. PATENT DOCUMENTS

| | | | |
|---|---|---|---|
| 3,309,617 | 3/1967 | Lancaster et al. | 330/283 |
| 3,374,404 | 3/1968 | Luecke | 357/58 |
| 3,396,317 | 8/1968 | Vendelin | 357/58 X |
| 3,518,585 | 6/1970 | Wilcox | 357/58 X |
| 3,536,934 | 10/1970 | Hall et al. | 307/237 |
| 3,538,448 | 11/1970 | Harford | 330/283 |
| 3,624,561 | 11/1971 | Tongue | 333/6 |
| 3,800,229 | 3/1974 | Backwinkel et al. | 325/381 |
| 3,813,602 | 5/1974 | Van Dijum et al. | 307/264 X |
| 3,942,181 | 3/1976 | Berrod et al. | 330/283 X |
| 4,143,383 | 3/1979 | Van Rooiji et al. | 357/58 X |

FOREIGN PATENT DOCUMENTS 44-365    1/1969    Japan ........................................ 330/283

OTHER PUBLICATIONS

Badal, "Variable Gain Amplifier for AGC", *IBM Technical Disclosure Bulletin*, vol. 5, No. 9, Feb. 1963, p. 32.

*Primary Examiner*—James B. Mullins

*Attorney, Agent, or Firm*—Eugene M. Whitacre; William H. Meagher; W. Brinton Yorks, Jr.

[57] ABSTRACT

A gain controlled amplifier is provided which is capable of handling a wide range of input signal levels without the need for input signal attenuation. A transistor is arranged in a common emitter amplifier configuration and includes a PIN diode as a controllable impedance in the emitter circuit. An input signal and a gain control voltage are applied at the base of the transistor. As the input signal level increases, the gain control voltage is decreased, causing an increase in the substantially resistive impedance of the PIN diode, which bears a constant relationship to the decreasing gain control voltage (i.e., a linear relationship on a semilog plot). The gain of the transistor amplifier is thereby reduced. At high input signal levels, the impedance of the PIN diode comprises a large resistive component in parallel with a large reactive (i.e., small capacitive) component at the emitter of the transistor, thereby affording substantial gain reduction. A novel PIN diode is provided for use in such a gain controlled amplifier, comprising a first localized region of high resistivity semiconductor material having a substantially planar surface. Second and third localized regions of one type conductivity are located in the high resistivity region adjacent to the surface. A fourth localized region of opposite type conductivity is located in the high resistivity region adjacent to the surface and intermediate the second and third localized regions, and is separated laterally from the first and second regions by zones of the high resistivity material.

15 Claims, 8 Drawing Figures

GAIN CONTROLLED AMPLIFIER USING A PIN DIODE

This invention relates to transistor amplifier circuits, and more particularly, to a gain controlled transistor amplifier circuit using a PIN diode as a variable resistance device, and to a novel PIN diode structure which may be advantageously used in such a gain controlled amplifier.

The invention as described herein may be embodied in either discrete circuit form or in integrated circuit form, depending on the needs and desires of the user. The term integrated circuit, as used herein, refers to a unitary or monolithic semiconductor device or chip which is the equivalent of a network of interconnected active and passive circuit elements.

to be useful in a signal processing system, such as the intermediate frequency amplifier of a television receiver, a gain controlled amplifier must be capable of handling a broad range of input signals. The amplifier must be able to substantially amplify very weak input signals, but must also be responsive to gain control so that very strong input signals are processed linearly, and do not produce a distorted output signal.

This goal of linear amplification over a broad range of input signals is complicated by the nonlinear transfer characteristic of a transistor. The transfer characteristic, that is the plot of collector current as a function of base-emitter voltage, is exponential, and hence the slope at any point along the transfer characteristic is also exponential. As a result, when a signal is applied to the base of a transistor, there is a distortion in the output signal. However, for small signals, this distortion is tolerable, because small increments along the transfer characteristic approximate a linear plot and the distortion is not pronounced. But, as the input signal becomes larger, this approximation no longer holds true, and greater amounts of distortion occur. In a television intermediate frequency amplifier, such large signal operation can lead to amplitude distortions and cross modulation and intermodulation distortion as the various signal carriers and their sidebands interact.

Large signal distortion of a transistor amplifier may be maintained within tolerable limits by limiting the signal levels which are applied to the base of the transistor. As described in U.S. Pat. No. 3,628,166, it has been found that the maximum signal swing at the base electrode of a common emitter integrated circuit transistor should be of the order of 10 millivolts to prevent distortion in the output signal. The prior art technique for limiting input signals to this level is to attenuate input signals which exceed 10 millivolts, as described in the above-mentioned patent and in U.S. Pat. No. 3,538,448. However, in addition to the obvious circuit complexity created by the inclusion of a controlled attenuator in the amplifier circuit, further disadvantages are also inherent in its use. As the input signal is attenuated, the signal-to-noise performance of the amplifier is degraded, since the noise level of the amplifier does not change, and may even increase, as the input signal level is reduced. Also, the increasing attenuation will change the impedance at the input to the amplifier, which can detrimentally affect the load impedances of filter networks in the circuit and can cause undesirable phase shifts in the output signal. It may therefore be necessary to buffer the attenuator with additional transistors to prevent this deleterious effect on tuned circuit elements. Thus, it is desirable for a gain controlled amplifier to be able to handle large input signals without distortion and without the need for an input signal attenuator.

In accordance with the principles of the present invention, a gain controlled amplifier is provided which is capable of handling a wide range of input signal levels without the need for input signal attenuation. A transistor is arranged in a common emitter amplifier configuration and includes a PIN diode as a controllable impedance in the emitter circuit. An input signal and a gain control voltage are applied at the base of the transistor. As the input signal level increases, the gain control voltage is decreased, causing an increase in the substantially resistance impedance of the PIN diode, which bears a constant relationship to the decreasing gain control voltage (i.e., a linear relationship on a semilog plot). The gain of the transistor amplifier is thereby reduced. At high input signal levels, the impedance of the PIN diode comprises a large resistive component in parallel with a large reactive (i.e., small capacitive) component at the emitter of the transistor, thereby affording substantial gain reduction. The high impedance of the PIN diode under large signal conditions permits the PIN diode to dissipate input signal voltages in excess of the maximum which is allowed to be dissipated across the base-to-emitter junction of the common emitter transistor, thereby allowing the amplifier to handle input signals in excess of those that the transistor alone can nominally handle without distortion. The amplifier has a gain control range which is 12 decibels better than that of a simple common emitter transistor amplifier, and 6 decibels better than that of a common emitter transistor having a conventional PN junction diode from the emitter impedance. The PIN diode controlled amplifier also provides signal-to-noise performance which is twice that of the PN diode amplifier, and four times better than that of the simple common emitter amplifier.

Ideally, the PIN diode of the novel gain controlled amplifier should have a purely resistive impedance, which is modulated by the D.C. bias current applied to the diode. This would be the case if the intrinsic I layer of the PIN diode were purely intrinsic, containing no impurity carriers. However, it is not technologically feasible to manufacture a PIN diode having a truly intrinsic I layer, since impurities will unavoidably be introduced into the I layer during the diffusion process. The impedance characteristic of the PIN diode will therefore have a small capacitive component, which will vary as a function of the intrinsic nature of the I layer material and the geometry of the device. The problem of minimizing the capacitance of the device is especially acute when the PIN diode is manufactured as an element of an integrated circuit, since typical integrated circuit semiconductor materials have poor intrinsic qualities, and many diffusion steps are usually involved in its manufacture.

If the impedance characteristic of the PIN diode has a large capacitive component, it will have a low impedance under reverse bias conditions and therefore a reduced range of impedance modulation. When the PIN diode is strongly forward biased, its resistance will be low, and its impedance will be determined virtually exclusively by this resistive component. However, when the forward bias of the PIN diode is reduced so as to increase its resistance, its capacitance will decrease with the decreasing bias current until a point is reached at which the parasitic capacitance becomes substantially constant with further decreases in bias current. Beyond this point, the capacitive reactance of the PIN diode, $X_c$, remains essentially constant, and thereafter will increasingly dominate the resistive component of the impedance of the PIN diode. The reactive component of the impedance will appear in parallel with the resistive component, thereby presenting an impedance to high frequency signals which is lower than that provided by the resistive component alone.

In accordance with a further aspect of the present invention, a novel PIN diode is provided which is characterized by a low forward biased impedance and a high reverse biased (i.e., reduced forward biased) impedance, and is advantageously used in the aforedescribed gain controlled amplifier. The PIN diode comprises a first localized region of high resistivity semiconductor material having a substantially planar surface. Second and third localized regions of one type conductivity are located in the high resistivity region adjacent to the surface. A fourth localized region of opposite type conductivity is located in the high resistivity region adjacent to the surface and intermediate the second and third localized regions, and is separated laterally from the first and second regions by zones of the high resistivity material. The PIN diode may be constructed using common integrated circuit materials and diffusion techniques, thereby readily lending itself to the construction of the aforedescribed gain controlled amplifier in integrated circuit form.

In accordance with yet another aspect of the present invention, the geometry of the novel PIN diode is selected so as to permit operation of the gain controlled amplifier as an intermediate frequency amplifier for a television receiver.

In the accompanying drawing:

FIG. 4a illustrates a cross-sectional view of a novel PIN diode;

FIG. 4b illustrates a plan view of the PIN diode of FIG. 4a; and

Figure 1:
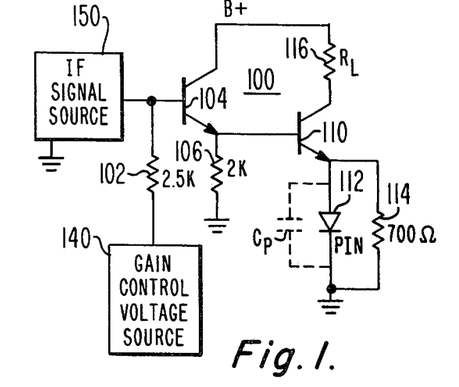
FIG. 1 illustrates, partially in schematic diagram form and partially in block diagram form, a gain controlled amplifier of the present invention.

Referring to FIG. 1, a gain controlled amplifier 100 constructed in accordance with the principles of the present invention is shown. In this embodiment, the amplifier 100 is used to amplify a television intermediate frequency (I.F.) signal supplied by an I.F. signal source 150. The gain of the amplifier 100 is controlled by a gain control voltage supplied by a gain control voltage source 140 by way of a resistor 102.

The I.F. signal and the gain control voltage are applied to the base of a buffer transistor 104, which is coupled in an emitter follower configuration. The collector of transistor 104 is coupled to a source of supply voltage (B+) and the I.F. signal and the gain control voltage are developed at the emitter of the transistor 104 is substantially the same form as they appeared at the base electrode, less the base-to-emitter voltage drop of the transistor. A load resistor 106 is coupled from the emitter of the transistor 104 to a source of reference potential (ground). The function of the transistor 104 is to transform the I.F. signal and gain control voltage from a high impedance to a lower impedance.

The I.F. signal and the gain control voltage at the emitter of transistor 104 are applied to the base of a transistor 110. Transistor 110 is arranged in a common emitter amplifier configuration, and has its collector coupled to the B+ supply by a load resistor 116, and its emitter coupled to ground by the parallel combination of a PIN diode 112 and a resistor 114. The anode of the PIN diode 112 is coupled to the emitter of transistor 110, and its cathode is coupled to ground. Amplified I.F. signals are developed at the collector of the transistor 110.

The PIN diode 112 has an I, or intrinsic, high resistivity semiconductor layer interposed between two highly doped layers of P type and N type material. Such PIN diodes are characterized by a very long minority carrier lifetime. At high frequencies (e.g., one megahertz, depending on the thickness and the purity of the intrinsic layer), the diode substantially ceases to act as a rectifier when forward biased, and assumes the characteristic of a linear variable resistor, with the resistance varying inversely with the D.C. bias current. Furthermore, unlike a normal PN junction diode, a PIN diode has very small characteristic capacitance. Thus, whereas the capacitive reactance due to the junction capacity across the PN junction of a regular PN diode will approach a relatively low level as the voltage applied to the PN diode is decreased, variations in the high capacitive reactance of a PIN diode are small enough to be negligible by comparison to the lower resistive component of the impedance of the PIN diode in many circuit applications.

The characteristics of the PIN diode are advantageously applied in the gain controlled amplifier 100 to achieve undistorted gain control over a wide range of input signal conditions, thereby eliminating the need for series and shunt attenuators under large signal conditions.

When a very weak, I.F. signal is applied to the amplifier 100, it is desirable to operate the amplifier in a high or maximum gain condition. This is accomplished by the application of a high level gain control voltage to the amplifier 100 by the gain control voltage source 140. The I.F. signal and gain control voltage are translated to the base of transistor 110 by transistor 104, thereby causing transistor 110 to operate in a high gain condition. Transistor 110 responds to the high gain control voltage by conducting a large D.C. current through its collector-to-emitter path. This D.C. current forward biases the PIN diode, causing the diode to have a low resistive impedance. Transistor 110 thus has a low emitter impedance by comparison to the load resistor 116, and will strongly amplify the weak I.F. signal at its base electrode.

As the strength of the I.F. signal supplied by the signal source 150 increases, the gain control voltage supplied by voltage source 140 is decreased. The decreasing gain control voltage reduces the conduction of D.C. bias current by transistor 110 to the PIN diode 112, thereby increasing its resistance. The relationship between the decreasing D.C. bias current and the resistance of the PIN diode 112 is constant over a wide range of bias currents, which ensures a linear relationship of the gain reduction of transistor 110 to the reduction in the gain control voltage. This feature of the present invention is of significant importance when the amplifier 100 is used in a constant speed automatic gain control system, where linear gain control is an important system requirement.

As the I.F. input signal at the base of transistor 110 increases, the I.F. signal voltage is dropped equally by dynamic resistance $r_e$ of the forward biased emitter junction of transistor 110, and the P-I-N junction of the PIN diode 112. The resistance $r_e$ increases continuously during this stage of gain reduction as the transconductance $g_m$ of transistor 110 is reduced. When the I.F. input signal at the base of transmitter 110 reaches approximately a 20 millivolt level, the transistor resistance $r_e$ has reached its maximum desired value, beyond which distortion is produced in the output signal, since further increases in $r_e$ will result in signal excursions in excess of 10 millivolts by the transistor 110. At this point, the component of emitter current conducted by resistor 114 stabilizes the transconductance $g_m$ of transistor 110, thus preventing any further increase in $r_e$. Since $r_e$ is held constant at this point by the emitter current conducted by resistor 114, any subsequent increase in the I.F. signal level will not be dropped across the base-to-emitter junction of transistor 110, but will be dropped across the PIN diode 112. The PIN diode 112 will then become the determining gain reducing element as it bears the burden of further signal increases.

As the I.F. input signal level at the base of transistor 110 exceeds 20 millivolts, the gain control voltage at the base of transistor 110 is decreased still further, resulting in a continuing decrease in D.C. bias current for the PIN diode 112 and a further increase in the resistance of the PIN diode. The I.F. impedance of the PIN diode is increased further with increasing I.F. signal levels, until a 40 millivolt signal at the base of transistor 110 is divided such that a 10 millivolt signal drop appears across transistor 110 and the remaining 30 millivolts of signal is dropped across the PIN diode 112. Since the PIN diode ceases to be an effective rectifier at I.F. frequencies, and since transistor 110 is dropping no more than its maximum limit of 10 millivolts, the output signal at the collector of transistor 110 will not be distorted by the 40 millivolt signal level at the base of the transistor.

As explained above, the purpose of resistor 114 is to shift the I.F. signal loading to the PIN diode 112 after the base-to-emitter junction of transistor 110 has reached its distortion-free limit of 10 millivolts of signal excursion. Without the resistor 114, the I.F. input signal would tend to drop equally across the transistor 110 and the PIN diode 112, limiting the amplifier to a 20 millivolt input signal without distortion. However, it is possible to use the resistor 114 to achieve proportionate signal loading by the transistor 110 and the PIN diode 112 so that higher input signal levels than the aforementioned 40 millivolts can be handled without distortion. For example, by selection the resistor 114 so as to maintain the $r_e$ of the transistor 110 and the impedance of the PIN diode 112 in a continuous 1:9 ratio, I.F. signal levels up to 100 millivolts can be handled without distortion. A 10 millivolt signal will then split with 1 millivolt appearing across the transistor 110, and 9 millivolts across the PIN diode 112. A 50 millivolt signal will be divided by the amplifier, with 5 millivolts dropping across the transistor 110 and 45 millivolts across the PIN diode 112; and the maximum signal of 100 millivolts will be apportioned with 10 millivolts appearing across the transistor 110 and 90 millivolts across the PIN diode 112. Thus, it is seen that the signal handling capability of the amplifier 100 may be extended by the proper selection of circuit components and biasing.

The gain control voltage is illustratively shown as applied to the base of transistor 110 in FIG. 1 by the coupling of resistor 102 and the base-to-emitter path of transistor 104. However, the gain control voltage may be applied to the transistor 110 and the PIN diode 112 in any manner which simultaneously effects gain control biasing of these two devices. For example, the gain control voltage may be applied to the cathode of the PIN diode. In this configuration, the cathode of the PIN diode should be bypassed by a capacitor to ground for I.F. signal frequencies.

The gain controlled amplifier of the present invention is illustratively shown as a single-ended input amplifier in FIG. 1 for amplifying signals which are referenced to ground. It may be appreciated that two circuits arranged as shown in FIG. 1 may be coupled to form a differential amplifier by driving them with complementary, anti-phase input signals. In such an arrangement, the output signals would be differentially related. The two circuits 100 may be rearranged to require only a single connection to the gain control voltage source 140 by coupling the cathodes of the two PIN diodes directly to the gain control voltage source 140. The voltage source 140 will thus operate as the source of D.C. biasing current for the PIN diodes 112 and the two push-pull driven transistors 110. The two emitter resistances 114 will continue to be coupled to ground. The cathodes of the PIN diodes should be bypassed to ground for I.F. signals in this configuration.

The features of the gain controlled amplifier 100 of FIG. 1 cannot be obtained when using a normal PN junction diode in place of the PIN diode 112. First, the parasitic capacitance $C_p$ of a PN diode limits the range of gain reduction of the amplifier as compared to the PIN diode. As previously discussed, the gain of amplifier 100 is reduced by increasing the emitter impedance of transistor 110. As the D.C. bias current to the PIN diode is reduced, the resistance of the PIN diode increases, thereby increasing the emitter impedance of transistor 110 and reducing the gain of the amplifier 100. If a normal PN diode were used in the emitter circuit for transistor 110, decreasing D.C. bias current would not only increase the resistance of the device, but would also stabilize its parasitic capacitance $C_p$ at a certain level. The capacitance $C_p$ would be effectively in shunt with the PN diode, as shown by the broken line capacitor $C_p$ in FIG. 1. At I.F. frequencies, the parasitic capacitance would provide a reactive impedance in shunt with the resistive impedance of the diode, which is inversely proportional to the frequency f and the capacitance C, and may be expressed as $$X_c = (1/2\pi f C)$$

Figure 2:
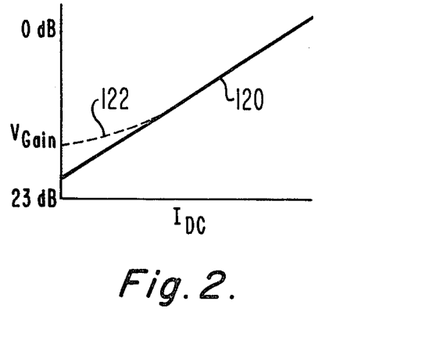
FIG. 2 illustrates graphically the gain reduction capability of the amplifier of FIG. 1.

The net result of the increasing resistive impedance and the stabilized reactive impedance of the PN diode is an essentially constant impedance between the emitter of transistor 110 and ground, which will no longer cause the gain of the amplifier 100 to decrease. This effect is illustrated in FIG. 2, in which the gain reduction of the PIN diode amplifier 100 with decreasing D.C. bias current is represented by the solid line 120. The broken line 122 illustrates the departure from linear gain reduction caused by the use of a normal PN junction diode in place of the PIN diode 112. It may be noted that the gain reduction represented by broken line 122 will also obtain if the impedance of the PIN diode 112 has a significant capacitive reactance component.

Figure 3A:
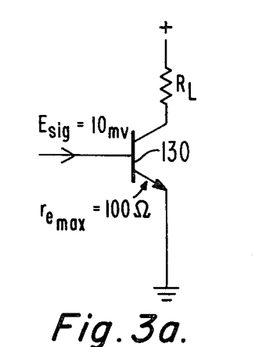
FIG. 3a illustrates schematically a common emitter amplifier.

Finally, it may be seen that the gain controlled amplifier 100 provides a 3 decibel improvement in signal-to-noise performance as compared to other common emitter amplifiers. Referring to FIG. 3a, a transistor 130 is shown coupled in a common emitter configuration, having an emitter coupled to ground and a collector coupled to a load resistor $R_L$. An input signal $E_{sig}$ is applied to the base electrode. For reasons previously given, it is assumed that transistor 130 is capable of handling a maximum input signal of 10 millivolts without producing a distorted output signal at the load resistor $R_L$. When $E_{sig}$ is at its maximum level of 10 millivolts, the transistor is operated in a minimum gain condition, and its dynamic emitter resistance $r_e$ has a maximum value, $r_{e\ max}$. For purposes of this analysis, $r_{e\ max}$ is normalized to a value of 100 ohms.

Figure 3B:
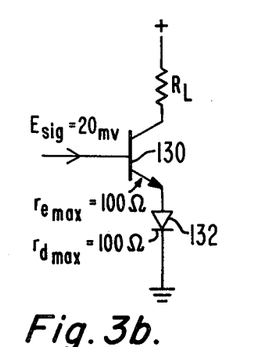
FIG. 3b illustrates schematically a common emitter amplifier having a diode in the emitter circuit.
Figure 3C:
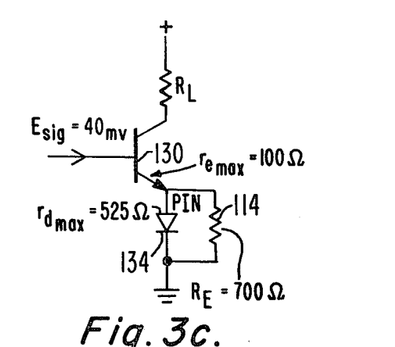
FIG. 3c illustrates schematically a common emitter amplifier embodying the present invention.

The signal-to-noise power level of a transistor amplifier may be expressed to a first approximation by $$S/N = ((E_{sig})^2 / RkTB)$$

where R is the total value of the resistances in the amplifier, k is Boltzmann's constant, T is absolute temperature, and B is the bandwidth of the amplifier. As is well known, resistances are the primary noise generators in a circuit. For comparison purposes, the sum of the circuit resistances is an accurate representation of the noise performance of the amplifiers shown in FIGS. 3a, 3b, and 3c. Also, resistances which are characteristic of all three amplifiers, such as the load resistor $R_L$, the distributed intrinsic base resistance $r_{bb}$, and ohmic contact resistances, will be assumed to be constant for each FIGURE and may be ignored for comparison purposes. Also, k, T, and B will be assumed to be constant for each FIGURE, and will be omitted from the comparative calculations. Using the above expression, the signal-to-noise power level of the circuit of FIG. 3a is seen to be $$\frac{(E_{sig})^2}{R} = \frac{(10mv)^2}{100\Omega} = \frac{100}{100} = 1$$

Referring to FIG. 3b, transistor 130 is seen to be coupled in a common emitter configuration with a PN junction diode 132 coupled from the emitter of the transistor 130 to ground. For uniformity, the diode 132 is assumed to be constructed of the same type of semiconductor material and geometry as the transistor 130, and thus will exhibit a dynamic forward biased resistance $r_D$ which matches that of the emitter of transistor 130. Therefore, when the transistor 130 is in its minimum gain condition, $r_{D\ max}$ will be equal to $r_{e\ max}$, which is 100 ohms.

The circuit of FIG. 3b differs from that of FIG. 3a in that there are two PN junctions between the input base electrode and ground: that of the base-to-emitter junction of transistor 130 and that of the diode 132 junction. These two junctions increase the signal handling capability of the circuit from 10 millivolts to 20 millivolts, since the input signal will be evenly distributed across the two junctions. Above 20 millivolts, distortion will occur as the signal handling capabilities, of both the transistor 130 and the diode 132 are exceeded, and diode rectification occurs. Thus, the signal-to-noise power level of the circuit of FIG. 3b is seen to be related by $$\frac{(E_{sig})^2}{R} = \frac{(20mv)^2}{100\Omega + 100\Omega} = \frac{400}{200} = 2$$

It is seen that the signal-to-noise performance of the circuit of FIG. 3b is twice that of the circuit of FIG. 3a, or a 3 decibel improvement.

Referring to FIG. 3c, transistor 130 is coupled in a common emitter amplifier configuration, having a PIN diode 134 and an emitter resistor $R_E$ coupled in parallel between the emitter of transistor 130 and ground. As explained in conjunction with FIG. 1, the emitter resistor $R_E$ draws a component of current from the emitter of transistor 130 which ensures that the dynamic emitter resistance $r_e$ of the transistor does not exceed its desired maximum value, in this example, 100 ohms, under minimum gain conditions. The remaining current provided by transistor 130 is effective to forward bias the PIN diode 134 so that its resistance approaches that of the emitter resistor $R_E$. In this example, $R_E$ has a value of 700 ohms, and the resistance of the PIN diode in the minimum gain (maximum signal) condition is 525 ohms, producing a net resistance of 300 ohms for the parallel combination. The circuit of FIG. 3c is therefore capable of handling a 40 millivolt input signal, which will be dropped proportionately across the transistor 130 and the emitter resistance: 10 millivolts across the transistor 130 and 30 millivolts across the 300 ohm emitter resistance. The PIN diode will cause no distortion when handling a 30 millivolt signal drop by virtue of its poor rectification properties.

When these values are applied to the signal-to-noise power level expression, the result is $$\frac{(E_{sig})^2}{R} = \frac{(40mv)^2}{100 + 300} = \frac{1600}{400} = 4$$

It is therefore seen that the signal-to-noise performance of the PIN diode amplifier is twice that of the PN diode amplifier, and four times that of the simple common emitter amplifier. The PIN diode amplifier thus provides a 3 decibel signal-to-noise improvement when compared to the PN diode amplifier, and is 6 decibels better than the simple common emitter amplifier.

It was previously mentioned that it is important for the PIN diode 112 of FIG. 1 to have negligible capacitance, to permit a maximum range of gain reduction in the amplifier 100. Since the capacitive reactance $X_c$ of the PIN diode is a function of both capacitance and frequency, the frequency of operation of the PIN diode circuit must be considered when determining the maximum amount of tolerable capacitance. A novel PIN diode which is characterized by a capacitive component that permits satisfactory operation of the amplifier 100 at television intermediate frequencies, and can be constructed as an element in a bipolar integrated circuit using conventional materials and manufacturing techniques, is illustrated in FIGS. 4a and 4b.

Figures 4A, 4B:
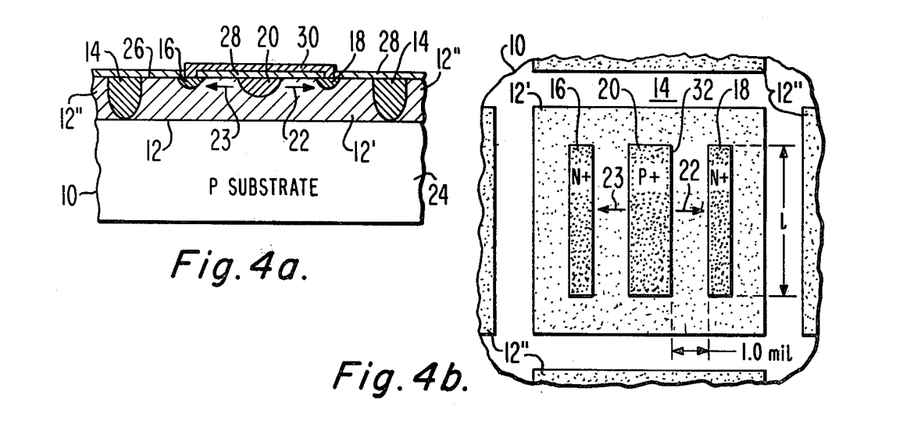

Referring first to FIG. 4a, a cross-sectional view of a PIN diode constructed in accordance with the principles of the present invention is shown. The PIN diode is shown as part of a bipolar integrated circuit device, including a body 10 of semiconductor material, usually silicon, which comprises a substrate 24 of one type conductivity and a lightly doped epitaxial layer 12 of opposite type conductivity. In usual practice, and in this example, the substrate 24 is of P type conductivity and the epitaxial layer 12 is of N type conductivity.

The epitaxial layer 12 is divided into separate islands 12' and 12'' by conventional P+ type isolation region 14. The isolation region 14 provides electrical separation between the epitaxial islands on the integrated circuit, each of which generally contains a separate active circuit element. Adjacent to the surface 26 of the epitaxial island 12' are diffused regions 16 and 18 of high carrier density N+ type material. Also adjacent to the surface 26 of the epitaxial island 12', and centered intermediate regions 16 and 18, is a third diffused region 20 of high carrier density P+ type material. The regions 16 and 18 of N+ type material are separated from the region 20 by zones of the epitaxial layer, as indicated by arrows 22 and 23. The N+ type regions are connected electrically by a metallized conductor 30 which makes contact with the N+ type regions through openings in an insulating layer 28 of silicon dioxide that overlays the surface 26 of the epitaxial layer 12. A separate metallized conductor (not shown) also passes through the insulating layer 28 to allow external connection to the P+ type region 20.

The PIN diode of FIG. 4a is comprised of a layer of P+ type material 20, an I layer of epitaxial material 12', and N layers of N+ type material 16 and 18. The forward biased current flow in the PIN diode is from the P+ type region 20 to the two N+ type regions 16 and 18, as indicated by the arrows 22 and 23.

Ideally, it would be desirable for the I layer material to be truly intrinsic; that is, to be completely free of impurities so as to have a virtually infinite resistance. With a truly intrinsic I layer, the capacitance of the device would vary least with reduction in the forward bias voltage, thereby permitting a low forward biased impedance and a high reverse biased impedance. In practice, a true intrinsic layer does not exist in a PIN diode, because it has not been technologically feasible to maintain intrinsic resistivity in the I layer through the processing of a diode. Typically, the I layer is lightly doped, with a resistivity of approximately 1000 ohm-cm. However, it has been found that the PIN diode of the present invention can utilize conventional bipolar integrated circuit epitaxial material for the I layer, which has a typical resistivity of from one to six ohm-cm.

This may be understood by referring to FIG. 4b, which shows a plan view of the integrated circuit at the surface 26 of the epitaxial layer 12. Since a PIN diode is a device having P, I, and N layers, it may be seen that a PIN diode is formed by the P+ type region 20, the N+ type region 18, and the intervening epitaxial zone indicated by arrow 22. A measure of the quality of this PIN diode is the ratio of its (low) forward biased impedance to its (high) reverse biased impedance. Once the properties of the semiconductor materials of the P, I, and N layers have been determined, the forward impedance—vs—reverse impedance ratio can be improved only by changing the geometries of the layers. For the lateral PIN diode described above, the ratio is improved by increasing the length l of the P and N layers 20 and 18, which reduces the forward biased impedance of the PIN diode. However, it has been found that increasing the length l of the P+ type region 20 results in an undesired decrease in the reverse biased impedance of the PIN diode. This is because the capacitance at the junction 32 of the P+ type region 20 and the lightly doped epitaxial layer 12' increases as the P+ type region 20 is lengthened. In effect, this junction capacitance is a function of the area of the P+ type region 20. The increased capacitance decreases the capacitive reactance $X_c$ as the PIN diode is reverse biased, thereby causing a reduction in the reverse biased impedance.

This problem of increased capacitance is solved in the present invention by the provision of a second N layer 16 of N+ type material on the opposite side of the P+ type region 20 from the N layer 18. The second N layer effects a doubling of permissible forward biased current flow from the P+ region 20 to the N layers of the PIN diode as indicated by a second arrow, 23, thereby halving the minimum forward biased resistance of the device. The capacitance of the device is not affected by the provision of this second N+ type region, because the area of the P+ type region 20 has not changed. The new PIN diode has geometries comparable to those of other bipolar integrated circuit devices and thus readily lends itself to efficient manufacture on a typical integrated circuit chip.

Furthermore, it has been found that a 1.0 mil spacing between the P+ and N+ type regions provides satisfactory operating characteristics in the NTSC television intermediate frequency range of approximately 45 MHz. When operating at higher frequencies, this dimension may be reduced, and for lower frequencies, this dimension may be increased. The device has been constructed and tested at NTSC intermediate frequencies using a 4.2 mil length for the P+ and N+ type regions. A 0.9 mil dimension was used for the width of the P+ type region 20, and widths of 0.4 mil were used for the N+ type regions 16 and 18.

Figure 5:
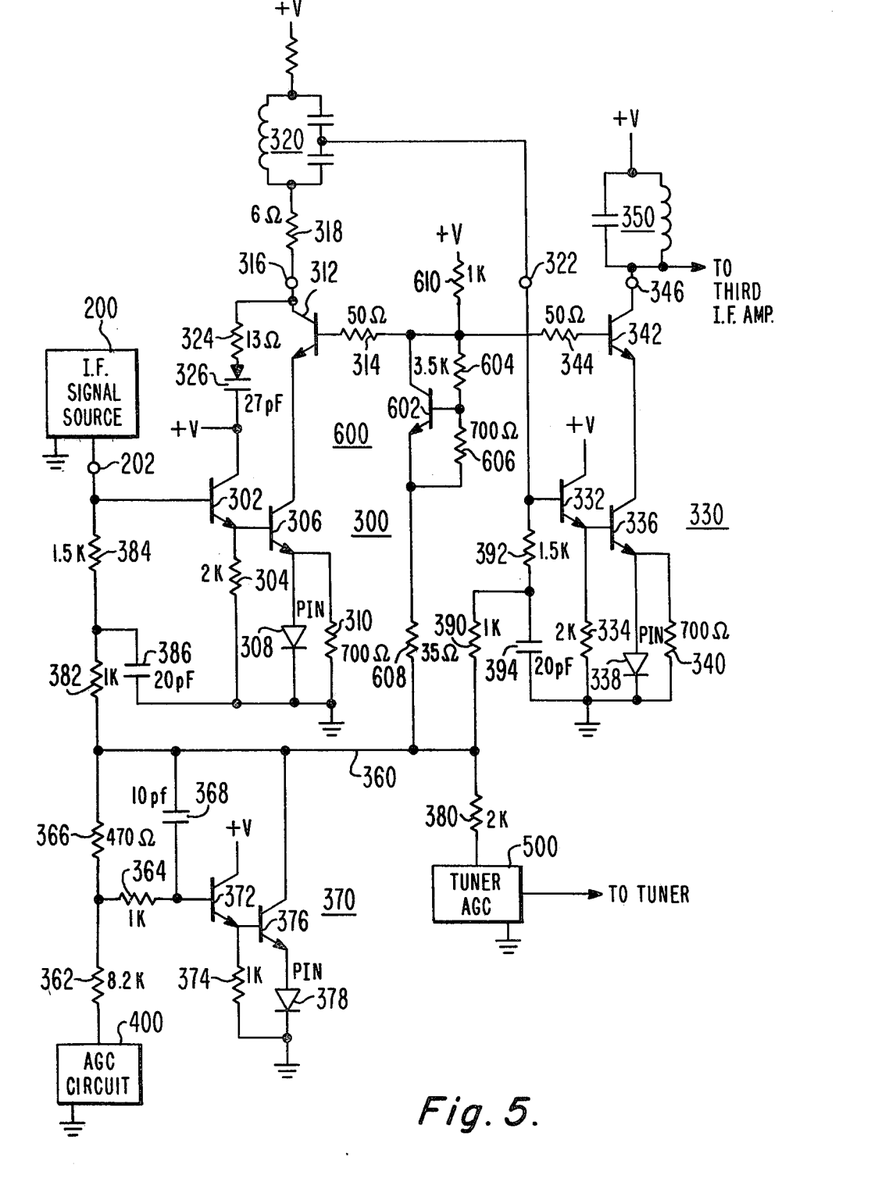
FIG. 5 illustrates, partially in block diagram form and partially in schematic diagram form, a television intermediate frequency amplifier embodying the present invention.

A television intermediate frequency amplifier which combines the features of both the gain controlled amplifier 100 and the novel PIN diode is illustrated in FIG. 5. This I.F. amplifier may be conveniently fabricated on a single integrated circuit chip having contact areas for coupling to circuit components, signal sources, and power supplies external to the chip.

The circuit shown in FIG. 5 amplifier I.F. signals supplied by an I.F. signal source 200. These I.F. signals are generally developed by a mixer in the television tuner, and are located in an I.F. passband formed by a filter network prior to the I.F. amplifier. The I.F. signal source 200 is coupled to the I.F. amplifier at an external contact terminal 202. The contact terminal 202 is coupled to the base of a buffer transistor 302 of a first I.F. amplifier 300. The collector of transistor 302 is coupled to a source of I.C. supply voltage (+V), and its emitter is coupled to a source of reference voltage (ground) by a resistor 304. The emitter of transistor 302 is also coupled to the base of a transistor 306. The emitter of transistor 306 is coupled to ground by the parallel combination of a resistor 310 and a forward biased PIN diode 308. The collector of transistor 306 is coupled to the emitter of a transistor 312, which has its base coupled to the +V supply by resistors 314 and 610, and its collector coupled to an external contact terminal 316. The collector of transistor 312 is also coupled to the +V supply by the serial connection of a resistor 324 and a voltage-variable capacitive device 326, which acts to peak the response of the amplifier in the vicinity of the picture carrier under weak signal conditions. Transistors 306 and 312 are arranged in a cascode amplifier configuration, and provide a first stage of controlled amplification for the I.F. signal.

An external tuned circuit 320 is coupled to the external contact terminal 316 by a resistor 318. The I.F. signal is then coupled from the tuned circuit 320 to the input of a second I.F. amplifier 330 by way of external contact terminal 322. The external contact terminal 322 is coupled to the base of a buffer transistor 332, which has its collector coupled to the +V supply and its emitter coupled to ground by a resistor 334.

The second I.F. amplifier 330 is configured in the same manner as the first I.F. amplifier 300, and is comprised of the buffer transistor 332, a cascode amplifier including transistors 336 and 342, a PIN diode 338 coupled from the emitter of common emitter transistor 336 to ground, and associated resistive components. The output of the second I.F. amplifier 330 is coupled from the collector of transistor 342 to an external tuned circuit 350 by an external contact terminal 346. The amplified I.F. signal is then supplied by the tuned circuit 350 to a third I.F. amplifier (not shown) for further amplification and subsequent signal processing.

The gain of I.F. amplifiers 300 and 330 is controlled by an I.F. gain control voltage developed from an AGC control voltage generated by AGC circuit 400. The AGC circuit 400 may be of a type which develops an AGC control voltage which varies in relation to the level of the detected video signal, such as that described in U.S. Pat. application No. 934,823, filed Aug. 18, 1978, now U.S. Pat. No. 4,218,708, and entitled "KEYED AGC CIRCUIT". The AGC control voltage is applied to the base of a transistor 372 in a dummy bias circuit 370 by the serial connection of resistors 362 and 364. The collector of transistor 372 is coupled to the +V supply, and its emitter is coupled to the base of a transistor 376 and to ground by a resistor 374. Transistor 376 has its emitter coupled to ground by a PIN diode 378, and its collector is coupled to an I.F. AGC bus 360. The I.F. AGC bus 360 is coupled to the base of transistor 372 by a capacitor 368 and is also coupled to the junction of resistors 362 and 364 by a resistor 366.

The dummy bias circuit 370 is so named because it controls the biasing current supplied to the first and second I.F. amplifiers 300 and 330, and is arranged to have a geometry which is a replica, or dummy, of that of the I.F. amplifiers. Specifically, it can be seen that the dummy bias circuit 370 has three base-to-emitter (3 $V_{be}$) voltage drops between the base of transistor 372 and the grounded cathode of PIN diode 378, which matches the similar 3 $V_{be}$ arrangements of the I.F. amplifiers. By reason of this geometry matching, quiescent current supplied by a multiple $V_{be}$ supply 600 is conducted by transistor 376 to ground, and is replicated in the complementary transistors 306 and 336 in the I.F. amplifiers in a ratio determined by the emitter areas of the respective transistors. For instance, if the emitter areas of these three transistors are all equal, a one milliampere collector-to-emitter current in transistor 376 will be replicated as one milliampere collector-to-emitter current in transistors 306 and 336. If the emitter areas of transistors 306 and 336 are twice the emitter area of transistor 376, a one milliampere collector-to-emitter current in transistor 376 will be replicated in transistors 306 and 336 as a two milliampere collector-to-emitter current in each of these transistors.

A multiple $V_{be}$ supply 600 acts as a current translator for the I.F. AGC bus 360. A transistor 602 has its collector coupled to the +V supply by a resistor 610 and its emitter coupled to the I.F. AGC bus 360 by a resistor 608. A resistor 604 is coupled from the collector to the base of transistor 602, and a resistor 606 is coupled from the base to the emitter of transistor 602. When resistors 604 and 606 are chosen to have the values illustratively shown in FIG. 5, the voltage at the emitter of transistor 602 (and also the I.F. AGC bus 360) remains at a level which is approximately 6 $V_{be}$'s below the voltage level at the collector of the transistor. In the absence of a gain control voltage from AGC circuit 400 (i.e., operation in a maximum gain condition), the voltage on the I.F. AGC bus 360 is maintained at approximately 3 $V_{be}$'s above ground by the dummy bias circuit 370. Under these conditions, the voltage applied to the bases of the common base cascode amplifier transistors 312 and 342 is approximately 9 $V_{be}$'s above ground potential. The multiple $V_{be}$ supply 600 maintains a constant voltage level on the I.F. AGC bus 360 in the absence of AGC control despite temperature variations in the circuitry by modulating the current drawn from the +V supply through resistor 610. The multiple $V_{be}$ supply 600 and the dummy bias circuit 370 are described more fully in my copending United States patent application Ser. No. 021,322, entitled "TEMPERATURE COMPENSATING BIAS CIRCUIT", concurrently filed herewith.

The I.F. AGC voltage on the bus 360 is applied to the base of transistor 302 of the first I.F. amplifier 300 by the serial connection of resistors 382 and 384. A capacitor 386 is coupled from the junction of resistors 382 and 384 to ground, which provides filter isolation of the I.F. AGC bus 360 from the I.F. signals at the base of transistor 302. Similarly, the I.F. AGC voltage is applied to the base of transistor 332 by the serial connection of resistors 390 and 392 from the I.F. AGC bus 360. The I.F. AGC bus 360 is isolated from the I.F. signal at the base of transistor 332 by a capacitor 394, which is coupled to ground from the junction of resistors 390 and 392 to provide low-pass filtering of the I.F. AGC voltage at that point. The I.F. AGC voltage is also applied to a tuner AGC circuit 500 by an isolation resistor 380. The tuner AGC circuit 500 responds to a decreasing I.F. AGC voltage at its input by generating a delayed R.F. AGC voltage, which is applied to the tuner in the television receiver (not shown).

In operation, the AGC circuit 400 develops an AGC control voltage which is directly related to the level of the detected video signal; a weak (low level) video signal will result in the generation of a low level AGC control voltage, and a strong (high level) video signal will result in the generation of a high level AGC control voltage.

The quiescent operating condition described above, in which the collector current of transistor 376 is replicated in transistors 306 and 336, establishes a certain potential at the I.F. AGC bus 360. When an AGC control voltage is applied to the dummy bias circuit 370 from the AGC circuit 400, this quiescent condition is altered, as transistor 376 responds by conducting an increasing amount of current through its collector-to-emitter path. This increased current flow reduces the potential on the I.F. AGC bus 360, which reduces the D.C. bias potential applied to the I.F. amplifiers 300 and 330 at the bases of transistors 302 and 332, respectively.

Under weak signal conditions, a low level AGC control voltage is applied to the dummy bias circuit 370, causing little change in the conduction of transistors 372 and 376. The voltage on the I.F. AGC bus 360 will therefore be at a high level of approximately 3 $V_{be}$'s. This high level I.F. AGC voltage is applied to the I.F. amplifiers 300 and 330 at the bases of transistors 302 and 332. Transistors 302, 306 and 332, 336 will thus conduct heavily, and high D.C. bias currents will be supplied to PIN diodes 308 and 338 by the transistors 306 and 336, respectively. The large bias currents will cause the PIN diodes to have low resistances, thereby providing low emitter resistances for transistors 306 and 336. The cascode amplifiers 306, 312 and 336, 342 will then provide substantial amplification for the week I.F. signal provided by I.F. signal source 200.

As the video signal level increases with an increase in the level of the received R.F. television signal, the level of the AGC control voltage developed by the AGC circuit 400 increases. The increasing AGC control voltage causes increased current flow through resistor 362 to the dummy bias circuit 370 and the I.F. AGC bus 360. Substantially all of this increased current flow is conducted to the I.F. AGC bus by resistor 366 and then to ground by transistor 376, which causes a voltage drop across resistor 366. Since the dummy bias circuit 370 will respond to the flow of current from the AGC circuit 400 by attempting to maintain the voltage level at the base of transistor 372 approximately 3 $V_{be}$'s, the voltage drop across resistor 366 is referenced to this 3 $V_{be}$ point and will cause the voltage on the I.F. AGC bus to fall below the 3 $V_{be}$ level. At this time, transistor 376 is conducting substantially all of the current provided by the AGC circuit 400 by way of resistor 366. The remaining portion of the current from the AGC circuit 400 is applied to the base of transistor 372 to cause this increased current conduction by the dummy bias circuit 370.

The decreased I.F. AGC voltage on the bus 360 is applied to the I.F. amplifiers 300 and 330, causing a reduction in the transconductance of transistors 306 and 336. The D.C. bias current supplied to PIN diodes 308 and 338 by transistors 306 and 336, respectively, decreases, and the resistances of the PIN diodes 308 and 338 increase. The increased emitter impedances of transistors 306 and 336 cause a reduction in the gain of the cascode amplifiers 306, 312 and 336, 342.

The AGC control voltage supplied by AGC circuit 400 will continue to increase as the video signal level increases, and the dummy bias circuit 370 will continue to lower the level of the I.F. AGC voltage on bus 360. The decreasing I.F. AGC voltage will continue to lower the $g_m$ of the I.F. amplifier transistors 306 and 336, and the resistances of the PIN diodes 308 and 338 will continue to increase. As discussed in conjunction with FIG. 1, the $g_m$ of transistors 306 and 336 will eventually reach a minimum level at which 10 millivolts of the I.F. signal is dropped across their respective dynamic emitter resistances $r_e$. At this point, the $g_m$ of the transistors 306 and 336 is stabilized by the current drawn by resistors 310 and 340, respectively, and further gain reduction is achieved by further increasing the resistances of the PIN diodes 308 and 338, permitting an additional drop of up to 30 millivolts across each of the PIN diodes. Finally, when a full 40 millivolt I.F. signal is being applied to the I.F. amplifiers by the I.F. signal source 200, the full range of I.F. gain reduction has been traversed, and any further gain reduction occurs in the tuner under the control of the delayed tuner AGC circuit 500. At the point of full I.F. gain reduction, the 40 millivolt I.F. signal at terminal 202 experiences essentially a unity voltage gain through the first I.F. amplifier 300 and appears as a 40 millivolt signal at the input to the second I.F. amplifier 330. The I.F. signal level at the output of the second amplifier is sufficient to drive the output impedance comprising tuned circuit 350 and the input of the third I.F. amplifier.

The television intermediate frequency amplifier shown in FIG. 5 has been constructed and tested in integrated circuit form, using the PIN diode structure shown in FIGS. 4a and 4b for diodes 308, 338 and 378. It was found that, at maximum gain reduction, the $r_e$ of transistor 306 was maintained at approximately 40 ohms by the current drawn by resistor 310. The impedance of the PIN diode 308 was found to vary from 4.5 ohms at full amplifier gain to 130 ohms at maximum gain reduction. At full amplifier gain, the capacitance of the PIN diode 308 was negligible (i.e., the PIN diode had a positive phase shift), and at maximum gain reduction the capacitance of the PIN diode 308 was measured as approximately 7 pf.

What is claimed is:

1. A gain controlled amplifier comprising:
   a transistor including base, emitter, and collector electrodes, and coupled in a common emitter amplifier configuration;
   a source of input signals coupled to said base electrode;
   a load impedance coupled to said collector electrode;
   a PIN diode direct current coupled between said emitter electrode and a point of reference potential, and biased for forward conduction; and
   a source of gain control voltage coupled to said transistor for simultaneously varying the bias of said transistor and said PIN diode.

2. A gain controlled amplifier comprising:
   a transistor including base, emitter, and collector electrodes, and coupled in a common emitter amplifier configuration;
   a source of input signals coupled to said base electrode;
   a load impedance coupled to said collector electrode;
   a PIN diode direct current coupled between said emitter electrode and a point of reference potential, and biased for forward conduction;
   a source of gain control voltage coupled to said transistor for simultaneously varying the bias of said transistor and said PIN diode; and
   a second transistor for coupling said load impedance to the collector electrode of said first transistor, said second transistor being arranged in a common base configuration, wherein said first and second transistors comprise a cascode amplifier.

3. A gain controlled amplifier comprising:
   a transistor including base, emitter, and collector electrodes, and coupled in a common emitter amplifier configuration;
   a source of input signals coupled to said base electrode;
   a load impedance coupled to said collector electrode;
   a PIN diode direct current coupled between said emitter electrode and a point of reference potential, and biased for forward conduction;
   a source of gain control voltage coupled to said transistor for simultaneously varying the bias of said transistor and said PIN diode; and
   a second transistor for coupling said load impedance to the collector electrode of said first transistor, said second transistor being arranged in a common base configuration, wherein said first and second transistors comprise a cascode amplifier, and wherein said first and second transistors, and said PIN diode are located on a single monolithic integrated circuit chip.

4. A gain controlled amplifier comprising:
a transistor including base, emitter and collector electrodes and a forward biased base-to-emitter junction;
a source of input signals coupled to said base electrode;
a load impedance coupled to said collector electrode;
a PIN diode direct current coupled between said emitter electrode and a point of reference potential and biased for forward conduction; and
a source of variable gain control voltage coupled to said transistor for simultaneously controlling the forward bias of said transistor and said PIN diode.

5. A gain controlled amplifier comprising:
a transistor including base, emitter and collector electrodes and a forward biased base-to-emitter junction;
a source of input signals coupled to said base electrode;
a load impedance coupled to said collector electrode;
a PIN diode direct current coupled between said emitter electrode and a point of signal reference potential and biased for forward conduction; and
a source of variable gain control voltage coupled to said PIN diode for simultaneously controlling the forward bias of said transistor and said PIN diode.

6. A gain controlled amplifier comprising:
an NPN transistor including base, emitter and collector electrodes;
a source of input signals coupled to said base electrode;
a load impedance coupled to said collector electrode;
a PIN diode having an anode direct current coupled to said emitter electrode and a cathode coupled to a source of reference potential; and
a source of variable gain control voltage coupled to the base of said transistor for simultaneously varying the forward biasing of said transistor and said PIN diode.

7. A gain controlled amplifier comprising:
a transistor including base, emitter, and collector electrodes;
a source of input signals coupled to said base electrode;
a load impedance coupled to said collector electrode;
a PIN diode direct current coupled between said emitter electrode and source of reference potential, and operated in a forward biased condition;
a resistor direct current coupled in parallel with said PIN diode, the D.C. voltage across said resistor being equal to the D.C. voltage across said PIN diode; and
a source of gain control voltage coupled to said transistor for simultaneously varying the forward biasing of said transistor and said PIN diode.

8. The gain controlled amplifier of claim 7, wherein said gain control voltage is variable over a range of voltages including a first range in which the transconductance of said transistor and the impedance of said PIN diode are varied and a second range in which the transconductance of said transistor is substantially constant and the impedance of said PIN diode is varied.

9. The intermediate frequency amplifier of claim 7, wherein said transistor, said PIN diode and said resistor are located on a single monolithic integrated circuit chip.

10. A gain controlled amplifier comprising:
a transistor having base, emitter, and collector electrodes;
a source of input signals coupled to said base electrode;
a load impedance coupled to said collector electrode; and
a PIN diode comprising
a first localized region of high resistivity semiconductor material having a substantially planar surface;
second and third localized regions of one type conductivity located in said high resistivity region adjacent to said surface; and
a fourth localized region of opposite type conductivity located in said high resistivity region adjacent to said surface and intermediate said second and third localized regions, said fourth localized region being separated from said second and third regions by zones of said high resistivity semiconductor material and direct current coupled to said emitter electrode;
means for electrically connecting said second and third localized regions to a source of reference potential; and
a source of gain control voltage coupled to said transistor for simultaneously varying the bias of said transistor and said PIN diode.

11. The gain controlled amplifier of claim 10, further comprising:
a second transistor for coupling said load impedance to the collector electrode of said first transistor, said second transistor being arranged in a common base configuration, wherein said first and second transistors comprise a cascode amplifier.

12. The gain controlled amplifier of claims 10 or 11, further comprising a resistor direct current coupled between said emitter electrode of said first transistor and said source of reference potential.

13. The gain controlled amplifier of claim 12, further comprising a third transistor having a collector electrode coupled to a source of supply voltage, a base electrode and an emitter electrode,
wherein said input signal source and said gain control voltage source are coupled to the base electrode of said third transistor, and the emitter electrode of said third transistor is coupled to the base electrode of said first transistor.

14. The gain controlled amplifier of claim 13, further comprising:
a second resistor coupled between the emitter electrode of said third transistor and said source of reference potential.

15. The gain controlled amplifier of claim 14, wherein said first, second and third transistors, said first and second resistors and said PIN diode are constructed on a single monolithic integrated circuit chip.

* * * * *